United States Patent [19]
Kizuki et al.

[11] Patent Number: 5,714,006
[45] Date of Patent: Feb. 3, 1998

[54] METHOD OF GROWING COMPOUND SEMICONDUCTOR LAYER

[75] Inventors: Hirotaka Kizuki; Yasutomo Kajikawa, both of Tokyo, Japan

[73] Assignee: Mitsubishi Denki Kabushiki Kaisha, Tokyo, Japan

[21] Appl. No.: 572,883

[22] Filed: Dec. 18, 1995

[30] Foreign Application Priority Data

Dec. 20, 1994 [JP] Japan .................. 6-316481

[51] Int. Cl.$^6$ .................................. C30B 25/09
[52] U.S. Cl. .................. 117/89; 117/101; 117/108; 117/901; 117/952; 117/953
[58] Field of Search .................. 117/101, 90, 89, 117/108, 952, 953; 497/109

[56] References Cited

U.S. PATENT DOCUMENTS

| | | | |
|---|---|---|---|
| 4,487,813 | 12/1984 | Kay | 428/620 |
| 4,588,451 | 5/1986 | Vernon | 148/175 |
| 4,855,240 | 8/1989 | Alasaki et al. | 117/952 |
| 5,290,393 | 3/1994 | Nakamura | 117/952 |
| 5,433,169 | 7/1995 | Nakamura | 117/952 |
| 5,587,014 | 12/1996 | Iyechika et al. | 117/952 |

FOREIGN PATENT DOCUMENTS

| | | |
|---|---|---|
| 4006449 | 9/1990 | Germany . |
| 432222 | 2/1992 | Japan . |
| 4317319 | 11/1992 | Japan . |
| 5301795 | 11/1993 | Japan . |
| 9216966 | 10/1992 | WIPO . |

OTHER PUBLICATIONS

Fujimura et al, "Heteroepitaxy of LiNbO$_3$ LiNb$_3$O$_8$ Thin Films On C-Cut Spphire", Journal of Crystal Growth, vol. 115, 1991, pp. 821–825.

Yamaguchi et al., "Anisotropic Ridge Growth by Step-Flow-Mode Metalorganic Chemical Vapor Deposition Using Diethylgallium-chloride", Jpn. J. Appl. Phys., vol. 32, Part 1, No. 11A, Nov. 1993, pp. 4885–4888.

Yamaichi et al., "Reduction of Stress in GaAs with In-Doped GaAs Intermediate Layer Grown on Si-Substrate by Metalorganic Chemical Vapor Deposition", Jpn. J. Appl. Phys., vol. 31., Pt. 1, No. 12A, Dec. 1992, pp. 3808–3811.

Xu et al., "Smoothing Effect of GaAs/Al$_x$Ga$_{1-x}$As superlattices grown by metalorganic vapor phase epitaxy", Appl. Phys. Lett. vol. 64, No. 22, May 30, 1994, pp. 2949–2951.

Strite et al., "GaN, AlN, and InN: A Review, " J. Vac. Sci. Technol. B. vol. 10, No. 4, Jul./Aug. 1992, pp. 1237–1266.

Shigeta et al., "Chemical Vapor Deposition of Single-Crystal Films of Cubic SiC on Patterned Si Substrates", Appl. Phys. Lett, vol. 55, No. 15, Oct. 9, 1989, pp. 1522–1524.

Fujita et al., "Low-Temperature Metalorganic Chemical Vapor Deposition of GaAs on Si by Alternate Gas Flow of the Source Materials", Jpn. J. Appl. Phys., vol. 31, Part 1, No. 2A, Feb. 1992, pp. 225–226.

Primary Examiner—Robert Kunemund
Attorney, Agent, or Firm—Leydig, Voit & Mayer, Ltd.

[57] ABSTRACT

A method of growing a compound semiconductor layer includes epitaxially growing a III-V compound semiconductor layer including nitrogen (N) for as the Group V element on a front surface of a semiconductor substrate of cadmium telluride (CdTe). Therefore, the atoms of the crystal lattice of the III-V compound semiconductor layer are periodically lattice-matched with the atoms of the crystal lattice of the CdTe semiconductor substrate, whereby the III-V compound semiconductor layer is epitaxially grown with high crystalline quality.

12 Claims, 6 Drawing Sheets

METHOD OF GROWING COMPOUND SEMICONDUCTOR LAYER

FIELD OF THE INVENTION

The present invention relates to a method of growing a compound semiconductor layer and, more particularly, to a method of growing a GaN series compound semiconductor layer applicable to a blue-green light emitting device.

BACKGROUND OF THE INVENTION

Blue-green light emitting devices are expected to be widely applied to photo-electro-magnetic disks, full-color displays, and street signals, on which research and development are suddenly activated in recent years. As materials for the blue-green light emitting device, ZnSe series materials, SiC series materials, and GaN series materials, i.e., III-V group compound semiconductor materials including nitrogen (N) for V element, were tried to be employed in application for semiconductor lasers and LEDs. Especially, the GaN series materials attract attention as the blue-green light emitting materials. For example, an LED which has an InGaN/AlGaN double hereto junction serving as an active layer and has luminance of 1 candela is developed.

In order to apply the GaN series materials to the semiconductor lasers, however, many problems to be solved remain. First, it is necessary to improve the crystal quality. Though GaN has a crystal structure in a cubic system or a hexagonal system, there is no substrate suitable for lattice-match to GaN in any cases as shown in the following table.

| material | crystal structure | energy band gap (eV) | lattice constant (angstrom) | coefficient of thermal expansion $(10^{-6}/K)$ |
|---|---|---|---|---|
| GaN | hexagonal | 3.39 | a = 3.189 | 5.59 |
|  |  |  | c = 5.185 | 3.17 |
|  | cubic | 3.30—3.45 | a = 4.5–4.55 | — |
| AlN | hexagonal | 6.2 | a = 3.112 | 4.2 |
|  |  |  | c = 4.982 | 5.3 |
|  | cubic | 5.11 | a = 4.33 | — |
| InN | hexagonal | 1.89 | a = 3.548 | — |
|  |  |  | c = 5.760 |  |
|  | cubic | 2.2 | a = 4.98 | — |
| BN | hexagonal | 5.8 | a = 6.661 | 2.7 |
|  |  |  | c = 2.5040 | 3.7 |
|  | cubic | 14.5 (direct) 6.4 (indirect) | a = 6.6155 | –1 |
| ZnS | hexagonal | 3.8 | a = 3.820 | — |
|  |  |  | c = 6.260 |  |
|  | cubic | 3.54 | a = 5.4093 | — |
| ZnSe | cubic | 2.67 | a = 5.6687 | — |
| CdS | hexagonal | 2.41 | a = 4.1368 | — |
|  |  |  | c = 6.7163 |  |
| CdSe | hexagonal | 1.74 | a = 4.2985 | — |
|  |  |  | c = 7.0150 |  |
| $Al_2O_3$ | cubic | — | a = 4.758 | 7.5 |
|  |  |  | c = 12.991 | 8.5 |
| GaAs | cubic | 1.4 | a = 5.6533 | 6 |
| Si | cubic | 1.1 | a = 5.4301 | 3.59 |

Therefore, since the lattice-mismatch occurs and dislocation is generated in the crystal, it is difficult to obtain a GaN series epitaxially grown layer with high-quality. A monocrystalline GaN substrate is employed to solve such problem, but fabrication of the monocrystalline GaN substrate is technically difficult because of high vapor pressure of nitrogen. So, GaN itself can not be employed as the substrate.

FIG. 7 is a sectional view illustrating a crystal lattice structure of a semiconductor laminated structure comprising a sapphire substrate and a GaN layer disposed on the sapphire substrate, taken along the direction parallel to the arrangement direction of the crystal lattice, for explaining a prior art method of fabricating a compound semiconductor layer. In FIG. 7, reference numeral 100 designates a semiconductor laminated structure, numeral 101 designates a sapphire substrate, numeral 102 designates a GaN layer, numeral 101a designates atoms constituting the sapphire substrate 101 (hereinafter, referred to as sapphire substrate atoms), and numeral 102a designates atoms constituting the GaN layer 102 (hereinafter, referred to as GaN layer atoms). In the prior art semiconductor laminated structure shown in FIG. 7, the GaN layer 102 is epitaxially grown on the sapphire substrate 101 so as to lattice-match with the substrate. After the formation of the semiconductor laminated structure 100, a semiconductor device, such as a semiconductor laser device, is fabricated through desired process steps, such as, formation of other semiconductor layers on the semiconductor laminated structure 100.

As described above, in the prior art method of epitaxially growing the semiconductor layer comprising the GaN series material, the sapphire substrate 101 is usually employed as the substrate for the epitaxial growth. At the growth interface of the semiconductor laminated structure 100, the GaN layer atoms 102a are arranged along the arrangement direction of the crystal lattice of the sapphire substrate atoms 101a, and one GaN layer atom 102a is lattice-matched with one sapphire substrate atom 101a.

As shown in the above table, however, since the difference in the lattice constants between GaN and sapphire $(Al_2O_3)$, i.e., the degree of lattice-mismatch, is about 16% and the difference in the thermal expansion coefficients is about 20%, it is difficult to obtain an epitaxially grown layer with high-quality on the sapphire substrate 101. Although there is no report that has actually measured the dislocation density in the GaN series material which is epitaxially grown on the sapphire substrate, it is considered that dislocations of more than $10^8$ cm$^{-2}$ are produced. In a case where a semiconductor laser is produced using an epitaxially grown GaN series material, it is necessary to obtain an epitaxial growth layer having a dislocation density of lower than $10^4$ cm$^{-2}$ for the active layer of the semiconductor laser. In the epitaxially grown GaN series material layer, however, it is difficult to suppress the dislocation density to the low value, resulting in that no laser oscillation occurs when employing such GaN series semiconductor layer as the active layer.

As described above, it is difficult to grow a compound semiconductor layer comprising a material which has a lattice constant different from the lattice constant of the semiconductor substrate on the semiconductor substrate with high crystalline quality. So, it is very hard to obtain a high-quality semiconductor device including a compound semiconductor layer with high crystalline quality.

Especially, as described above, since there is no suitable substrate for growing a GaN series semiconductor layer thereon lattice-matching with the substrate, it is very hard to obtain a GaN series semiconductor layer with high crystalline quality.

SUMMARY OF THE INVENTION

It is an object of the present invention to provide a method of epitaxially growing a compound semiconductor layer comprising a material which has a lattice constant different from a lattice constant of a semiconductor substrate on the semiconductor substrate with high crystalline quality.

Other objects and advantages of the invention will become apparent from the detailed description that follows. The detailed description and specific embodiments described are provided only for illustration since various additions and modifications within the scope of the invention will be apparent to those of skill in the art from the detailed description.

According to a first aspect of the present invention, a method of growing a compound semiconductor layer includes epitaxially growing a III-V group compound semiconductor layer including nitrogen (N) for V group element on a front surface of a semiconductor substrate comprising cadmium telluride (CdTe). Therefore, the crystal lattice of the III-V group compound semiconductor layer is lattice-matched with the crystal lattice of the CdTe semiconductor substrate with a constant period, whereby the III-V group compound semiconductor layer including (N) for V group element is epitaxially grown with high crystalline quality.

According to a second aspect of the present invention, before the epitaxial growth of the III-V group compound semiconductor layer, forming a thin buffer layer comprising the same material as the material of the III-V group compound semiconductor layer including (N) for V group element is formed on the semiconductor substrate comprising CdTe, at a low temperature, whereby the III-V group compound layer including (N) for V element is epitaxially grown with high crystalline quality.

According to a third aspect of the present invention, the material of the III-V group compound semiconductor layer including (N) for V group element is one selected from the group consisting of GaN, AlN, InN, and a mixed crystal comprising two or more of these materials, whereby the III-V group compound semiconductor layer including (N) for V group element is epitaxially grown with high crystalline quality.

According to a fourth aspect of the present invention, the epitaxial growth is performed by MOCVD, MBE, GSMBE, CBE, VPE, or ALE, whereby the III-V group compound semiconductor layer including (N) for V group element is epitaxially grown with high crystalline quality.

According to a fifth aspect of the present invention, a method of growing a compound semiconductor layer includes growing a compound semiconductor layer on a front surface of a semiconductor substrate so that the lattice arrangement direction of the semiconductor layer in a plane parallel to a {100} plane is inclined by a prescribed angle from a lattice arrangement direction of the semiconductor substrate in the plane parallel to the {100} plane, thereby making some atoms constituting crystal lattices of the compound semiconductor layer match with some atoms constituting crystal lattices of the semiconductor substrate periodically.

According to a sixth aspect of the present invention, the front surface of the semiconductor substrate is inclined by a prescribed angle that provides an atomic step on the front surface of the substrate, in the direction perpendicular to the lattice arrangement direction of the compound semiconductor layer in the plane parallel to the {100} plane of the compound semiconductor layer, and the process of growing the compound semiconductor layer is performed by growing the semiconductor layer on the front surface of the semiconductor substrate by a step flow growth. Therefore, the compound semiconductor layer comprising the material which has the lattice constant different from the semiconductor substrate is epitaxially grown on the semiconductor substrate with high crystalline quality.

According to a seventh aspect of the present invention, the material of the semiconductor substrate is CdTe, the material of the compound semiconductor layer is III-V Group compound semiconductor including (N) for V element, and the angle of the lattice arrangement direction of the compound semiconductor layer with respect to the lattice arrangement direction of the semiconductor substrate in the plane parallel to the {100} plane is 45°. Therefore, the III-V group compound semiconductor layer including (N) for V group element is epitaxially grown on the CdTe semiconductor substrate with high crystalline quality.

According to an eighth aspect of the present invention, the process of growing the compound semiconductor layer is performed by growing the compound semiconductor layer on the front surface of the semiconductor substrate that is inclined in the <011> direction with respect to the {100} plane by the step flow growth. Therefore, the compound semiconductor layer comprising the material which has the lattice constant different from the semiconductor substrate is epitaxially grown on the semiconductor substrate with high crystalline quality.

According to a ninth aspect of the present invention, the material of the compound semiconductor layer is one selected from the group consisting of GaN, AlN, InN, and mixed crystal comprising two or more of these material. Therefore, the compound semiconductor layer comprising GaN, AlN, and InN, or the mixed crystal is epitaxially grown on the semiconductor substrate with high crystalline quality.

According to a tenth aspect of the present invention, the angle of the lattice arrangement direction of the compound semiconductor layer with respect to the lattice arrangement direction of the semiconductor substrate which is in the plane parallel to the {100} plane is 26.56°. Therefore, the compound semiconductor layer comprising the material which has the lattice constant different from the semiconductor substrate is epitaxially grown on the semiconductor substrate with high crystalline quality.

According to an eleventh aspect of the present invention, the process of growing the compound semiconductor layer is performed by growing atoms constituting the compound semiconductor layer on the front surface of the semiconductor substrate which is inclined in the <012> direction with respect to the {100} plane by the step flow growth. Therefore, the compound semiconductor layer comprising the material which has the lattice constant different from the semiconductor substrate is epitaxially grown on the semiconductor substrate with high crystalline quality.

According to a twelfth aspect of the present invention, the process of growing the compound semiconductor layer is performed by MOCVD, MBE, GSMBE, CBE, VPE, or ALE. Therefore, the compound semiconductor layer comprising the material which has the lattice constant different from the semiconductor substrate is epitaxially grown on the semiconductor substrate with high crystalline quality.

DETAILED DESCRIPTION OF THE PREFERRED EMBODIMENTS

Embodiment 1

Figure 1:
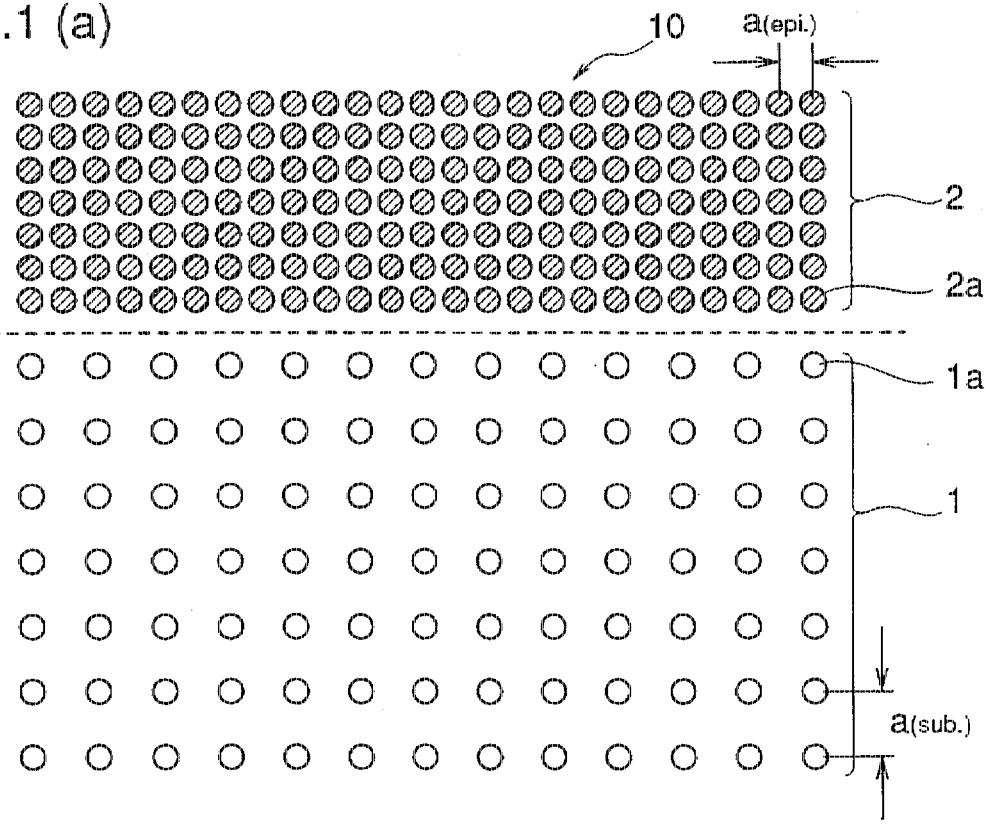
FIGS. 1(a)-1(b) are sectional views of a semiconductor laminated structure including a CdTe substrate and a GaN layer disposed on the CdTe substrate, illustrating a method of growing a compound semiconductor layer according to a first embodiment of the present invention.
Figure 1:
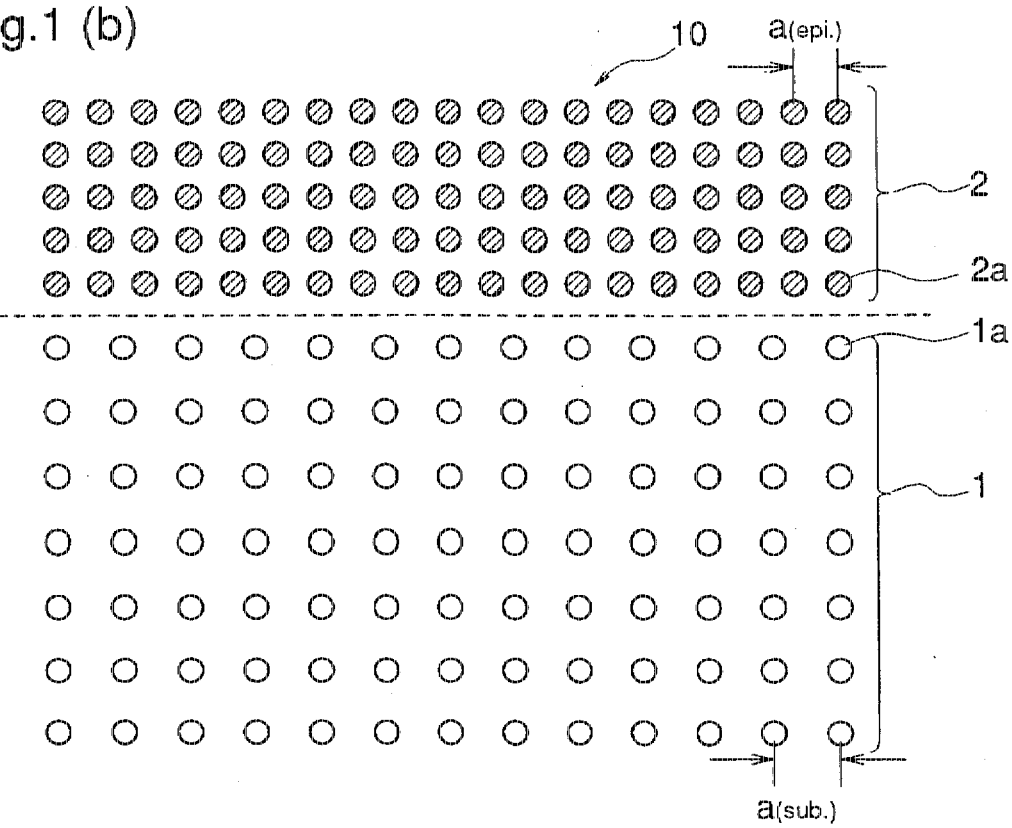

FIGS. 1(a)–1(b) are sectional views illustrating a crystal lattice structure of a semiconductor laminated structure including a cadmium telluride (CdTe) substrate and a GaN layer disposed on the CdTe substrate, taken along the direction parallel to the arrangement direction of the crystal lattice, for explaining a method of growing a compound semiconductor layer according to a first embodiment of the present invention. In FIGS. 1(a)–1(b), reference numeral 10 designates a semiconductor laminated structure, numeral 1 designates a CdTe substrate, numeral 1a designates atoms for constituting the CdTe substrate 1 (hereinafter, referred to as CdTe substrate atoms), numeral 2 designates a GaN layer, and numeral 2a designates atoms, constituting the GaN layer 2 (hereinafter, referred to as GaN layer atoms). In addition, the interval between adjacent CdTe substrate atoms 1a is a lattice constant a(sub.) of the CdTe substrate, and the interval between adjacent GaN layer atoms 2a is the lattice constant a(epi.) of the GaN layer.

The GaN layer 2 is epitaxially grown on the CdTe substrate 1 by metal organic chemical vapor deposition (hereinafter, referred to as MOCVD) to form the semiconductor laminated structure 10. After forming the semiconductor laminated structure 10, a desired semiconductor device, such as a semiconductor laser device, is fabricated through desired process steps, such as formation of other semiconductor layers on the semiconductor laminated structure 10.

In the semiconductor laminated structure 10, the lattice constant a(sub.) of the CdTe substrate 1 is 6.481 Å and the lattice constant a(epi.) of the GaN layer 2 is 3.189 Å in a case where GaN is of a hexagonal system, that is, the lattice constant a(sub.) is about twice as long as the lattice constant a(epi.). When the GaN layer 2 is epitaxially grown on the CdTe substrate 1, the GaN layer 2 is grown so that the crystal lattice of the GaN layer 2 is grown with every other atom 2a lattice-matched with 1a in the crystal lattice of the CdTe substrate 1 along the lattice arrangement of the CdTe substrate 1, as shown in FIG. 1(a). At the interface between the GaN layer 2 and the CdTe substrate 1, the GaN layer atoms 2a which are not lattice-matched with the CdTe substrate atoms 1a are present for every other atom along the lattice arrangement direction, and point defects are introduced by the generation of dangling bonds of these atoms. However, the GaN layer atoms 2a are lattice-matched with every other atom of the CdTe substrate atoms 1a at the interface between the GaN layer 2 and the CdTe substrate 1, the interval between the lattice-matching GaN layer atoms 2a is represented by $$a(epi.): 3.189 \times 2.0 = 6.378$$

where the degree of lattice-mismatch with the substrate 1 is 1.6%. It is known from this fact that the degree of lattice-mismatch is relaxed to a great extent as compared with the degree of lattice-mismatch of 16% in the prior art method where a GaN layer is grown on a sapphire substrate. Therefore, since, in the lattice-matched part, the lattice constant a(sub.) of the CdTe substrate 1 is about twice as long as the lattice constant a(epi.) of the GaN layer 2 in the hexagonal system, the lattice strain is not easily generated and dislocation is not generated, so that the crystalline quality of the epitaxially grown GaN layer 2 is not degraded. As a result, the GaN layer 2 with high crystalline quality is obtained.

When the GaN layer 2 is of a cubic system as a crystal structure, the lattice constant a(epi.) of the GaN layer 2 is 4.550 Å, and the lattice constant a(sub.) of the CdTe substrate 1 is about 1.5 times as long as the lattice constant a(epi.) of the GaN layer 2. Therefore, as shown in FIG. 1(b), the GaN layer 2 can be grown along the crystal arrangement direction of the CdTe substrate 1 so that every third atom 2a in the crystal lattice of the GaN layer 2 is lattice-matched with every other atom 1a of the CdTe substrate 1. Then, at the interface between the GaN layer 2 and the CdTe substrate 1, non-lattice-matched GaN layer atoms 2a and non-lattice-matched CdTe substrate atoms 1a are produced periodically, and point defects are introduced into the GaN layer 2 with the generation of dangling bonds of these non-lattice-matched atoms. However, in a part where the GaN layer atoms 2a are lattice-matched with the CdTe substrate atoms 1a at the interface between the GaN layer 2 and the CdTe substrate 1, since every other atom of the CdTe substrate atoms 1a is lattice-matched with every second atom of the GaN layer atoms 2a, the interval between the lattice-matching GaN layer atoms 2a corresponding to the lattice constant a(sub.) of the CdTe substrate atoms 1a is represented by $$a(epi.): 4.550 \times 1.5 = 6.378$$

where the degree of lattice-mismatch with the substrate 1 is 5.3%. Therefore, lattice strain is more unlikely to be generated than when a GaN layer is epitaxially grown on a sapphire substrate as in the prior art. However, a GaN layer 2 with high crystalline quality is obtained as in the case where the GaN layer 2 is of a hexagonal system. As a result, by fabricating a semiconductor device, such as a semiconductor laser device employing such GaN layer 2, a semiconductor device, with high performance and high-quality is realized.

According to the first embodiment of the present invention, since a CdTe substrate is employed as a substrate for epitaxially growing a GaN series crystal and a GaN layer is epitaxially grown on the substrate, a high-quality GaN layer with reducing degree of lattice-mismatch is obtained in both cases where the GaN layer is of a hexagonal system and where it is of a cubic system.

While in the first embodiment a GaN layer is employed as a semiconductor layer which is epitaxially grown on the CdTe substrate 1, in the present invention layers comprising III–V group compound semiconductor material including nitrogen (N) for V element, such as AlN and InN may be employed with the same effects as in the first embodiment.

While in the first embodiment a CdTe substrate is employed as a substrate, in the present invention a substrate comprising a material, in which a difference between the lattice constant of the substrate and a value of 2 or 1.5 times of the lattice constant of a layer comprising a III-V group compound semiconductor material including nitrogen (N) for V group element and formed on the substrate is less than 16% of the lattice constant of the substrate at least, may be employed with the same effects as in the first embodiment.

While in the first embodiment the GaN layer is epitaxially grown on the CdTe substrate by MOCVD, in the present invention any growth method of molecular beam epitaxy (MBE), gas source molecular beam epitaxy (GSMBE), chemical beam epitaxy (CBE), vapor phase epitaxy (VPE), and atomic layer epitaxy (ALE) may be employed as other growing method with the same effects as in the first embodiment.

Embodiment 2

Figure 2:
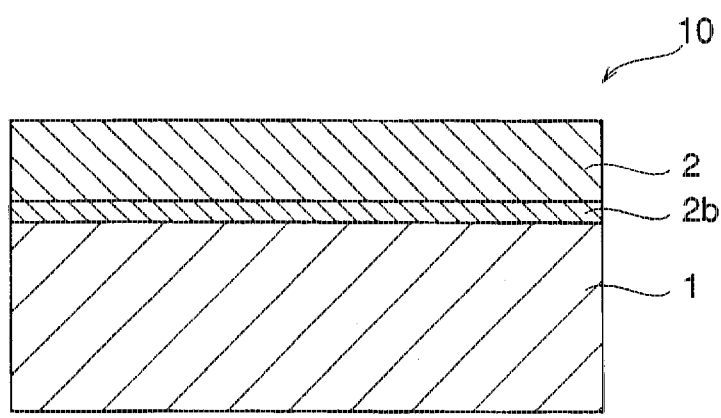
FIG. 2 is a sectional view of a semiconductor laminated structure illustrating a method of growing a compound semiconductor layer according to a second embodiment of the present invention.

FIG. 2 is a sectional view illustrating a method of growing a compound semiconductor layer according to a second embodiment of the present invention. In FIG. 2, the same reference numerals as in FIGS. 1(a)–1(b) designate the same or corresponding parts, where reference numeral 2b designates a GaN mixed crystal thin film buffer layer formed at a low temperature of 600° C. (hereinafter, referred to as buffer layer).

For the crystal growth of GaN, MOCVD method using triethylgallium (TEG) and ammonia ($NH_3$) as the material is mainly examined. In such growth method, since $NH_3$ is not easily decomposed at a low temperature, it is necessary to make the growth temperature higher, and usually epitaxial growth is performed at a high temperature exceeding 1000° C. When the epitaxial growth providing a high degree of lattice-mismatch is performed at such high temperature, a three-dimensional growth easily occurs and mirror surface is not easily obtained. In order to solve this problem, when a GaN crystal is grown on a sapphire substrate in the prior art, initially a thin GaN film in amorphous state is grown at a low temperature of about 600° C. and then the growth temperature is risen to the usual growth temperature of 1000° C. to grow a GaN epitaxial layer, that is, so called two-stage growth method is employed. It is confirmed that a GaN crystal having a mirror morphology is grown by the two-stage growth method.

Since the lattice-mismatch between the GaN crystal and the sapphire substrate is about 16% as already described above, however, it is impossible to obtain a high-quality epitaxial layer which is applicable to a semiconductor device, particularly a semiconductor laser, by only employing a two-stage growth method.

In this second embodiment, the two-stage growth method is applied to a growth method of a compound semiconductor layer in the above-described first embodiment. More specially, before epitaxial growth of the GaN layer 2, a GaN mixed crystal thin buffer layer 2b in an amorphous state is formed at a low temperature of 600° C., and then a GaN layer 2 is formed on the buffer layer 2b to obtain the semiconductor laminated structure 10 shown in FIG. 2. Also in this case, the same effects as in the first embodiment are obtained. Furthermore, since the buffer layer 2 is formed, a semiconductor laminated structure with high crystalline quality is obtained and a semiconductor device with higher performance is realized.

Embodiment 3

Figure 3:
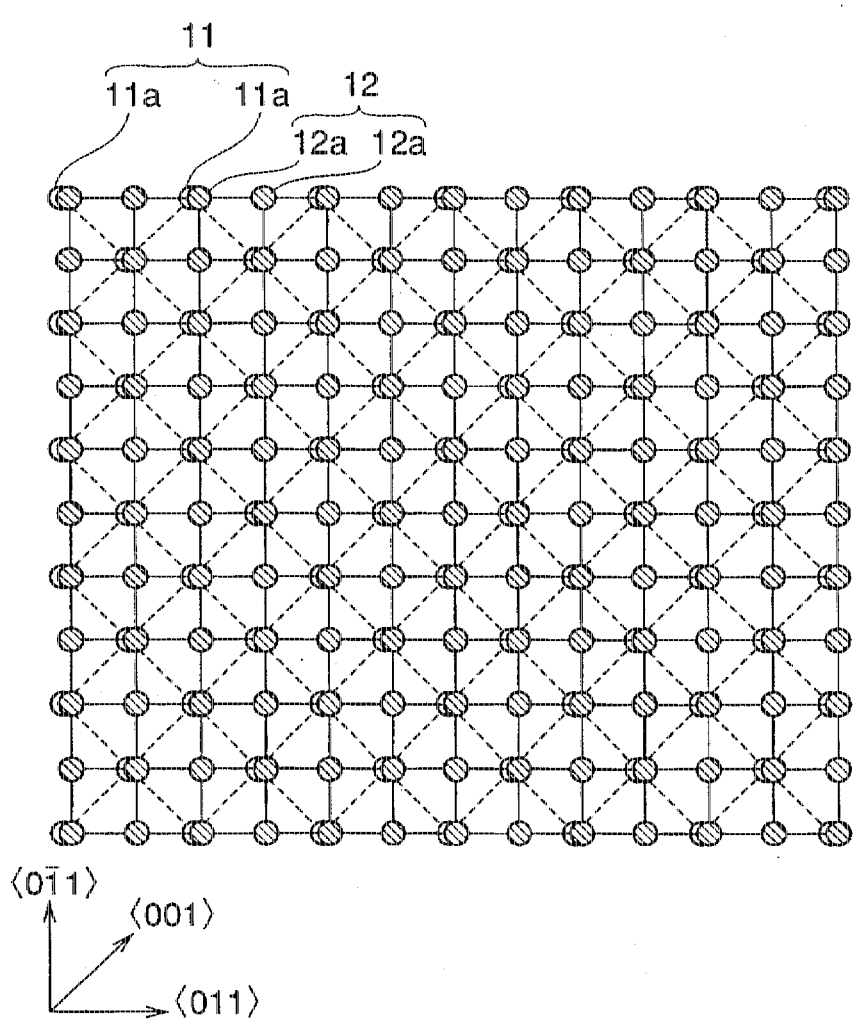
FIG. 3 is a plan view of a crystal lattice structure illustrating a method of growing a compound semiconductor layer according to a third embodiment of the present invention.

FIG. 3 is a plan view illustrating a method of growing a compound semiconductor layer according to a third embodiment of the present invention. FIG. 3 illustrates a crystal lattice structure of a GaN layer formed on a surface of a CdTe substrate which is inclined by several degrees from the {100} plane of the CdTe substrate in the <011> direction, viewed from the direction perpendicular to the {100} plane of the substrate. In FIG. 3, the same reference numerals as in FIGS. 1(a)–1(b) designate the same or corresponding parts. Reference numeral 11 designates a CdTe substrate having a surface which is inclined by several degrees, for example, by 2°, from the {100} plane in the <011> direction. Numeral 11a designates atoms constituting a CdTe substrate 11 (hereinafter, referred to as CdTe substrate atoms), numeral 12 designates a GaN layer, and numeral 12a designates atoms for constituting a GaN layer 12 (hereinafter, referred to as GaN layer atoms). A real line connecting the adjacent CdTe substrate atoms 11a shows a crystal lattice arrangement of the CdTe substrate 11, and a dotted line connecting the adjacent GaN layer atoms 12a shows a crystal lattice arrangement of the GaN layer 12, respectively. The arrangement direction of the crystal lattice of the CdTe layer 11 in the plane parallel to the {100} plane is <001> direction, and the arrangement direction of the crystal lattice of the GaN layer 12 is <0$\bar{1}$1> direction that is inclined by 45° from the <001> direction. In FIG. 3, in order to fabricate the understanding of the positional relation between CdTe substrate atoms 11a and the GaN layer atoms 12a, the GaN layer atoms 12a in positions overlapping the CdTe substrate atoms 11a are shifted a little from their original positions.

Figure 4:
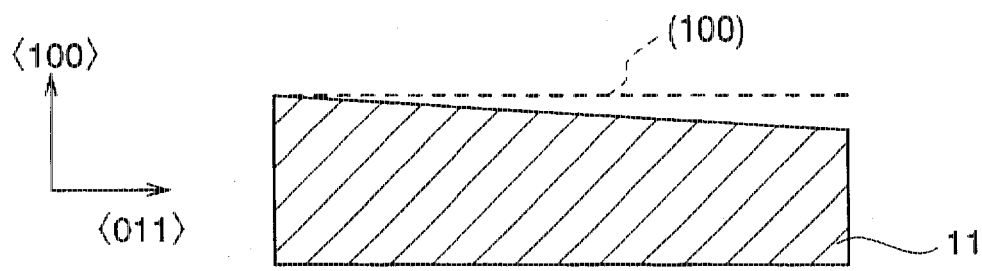
FIGS. 4(a)–4(d) are diagrams illustrating process steps in the growing method of the compound semiconductor layer according to the third embodiment of the present invention.
Figure 4:
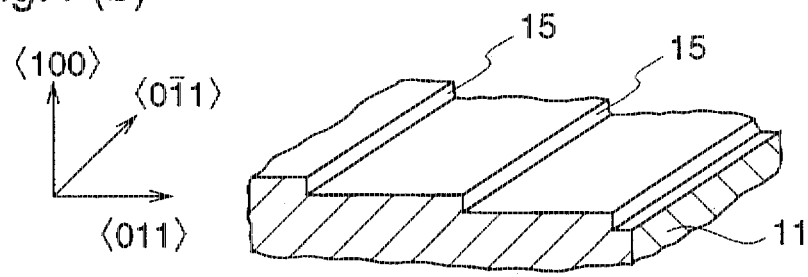
Figure 4:
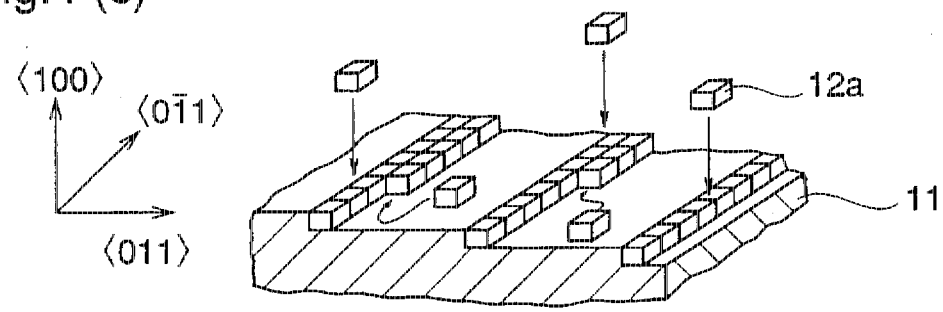
Figure 4:
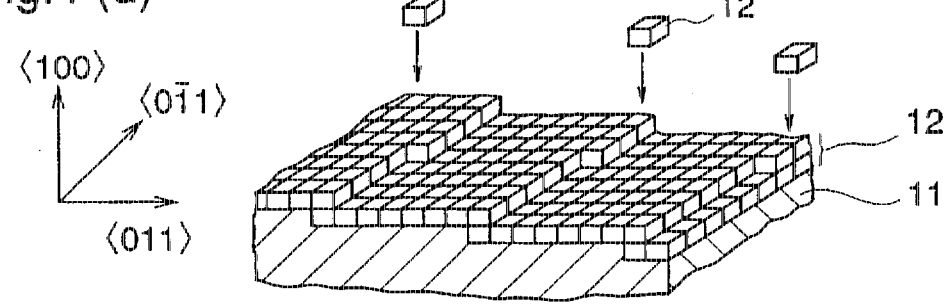

FIGS. 4(a)–4(d) are diagrams illustrating main process steps in a growth method of a compound semiconductor layer according to a third embodiment of the present invention. In the figures, the same reference numerals as in FIG. 3 designate the same or corresponding parts, where reference numeral 15 designates an atomic step. FIG. 4(a) is a cross-sectional view in (01$\bar{1}$) plane of the CdTe substrate 11 and FIGS. 4(b)–4(d) are perspective views of an enlarged portion near the surface of the CdTe substrate 11.

Figure 5:
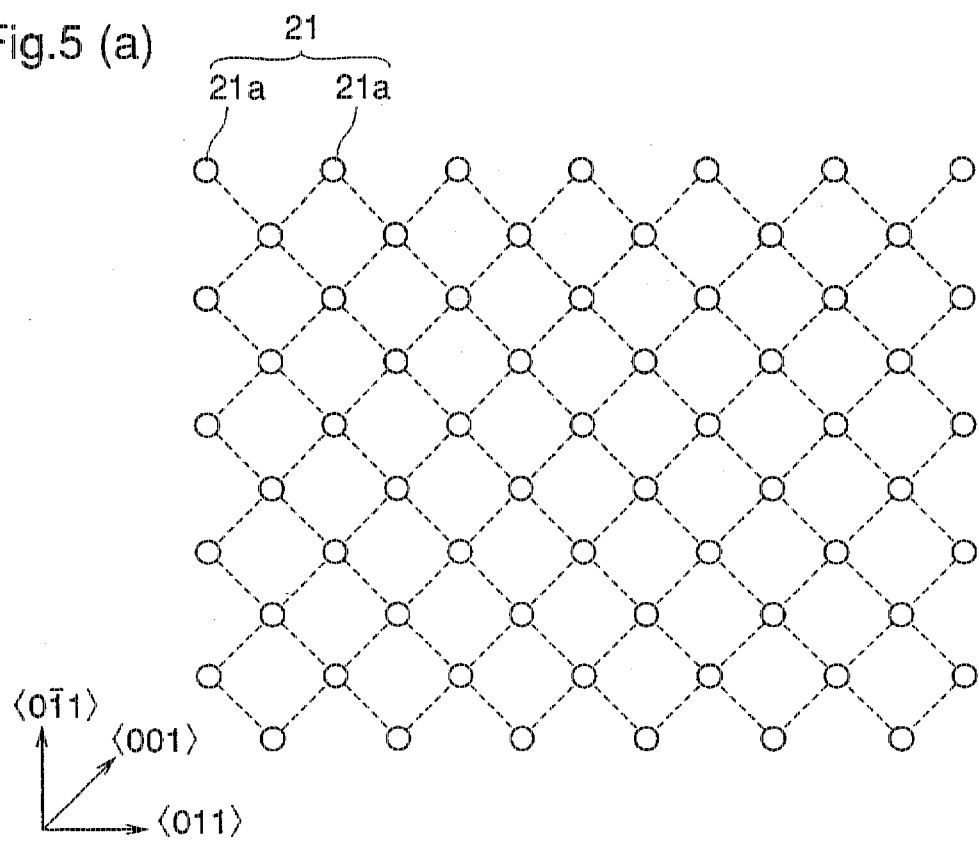
FIGS. 5(a)–5(b) are plan views of the crystal lattice structure illustrating the growing method of the compound semiconductor layer according to the third embodiment of the present invention.
Figure 5:
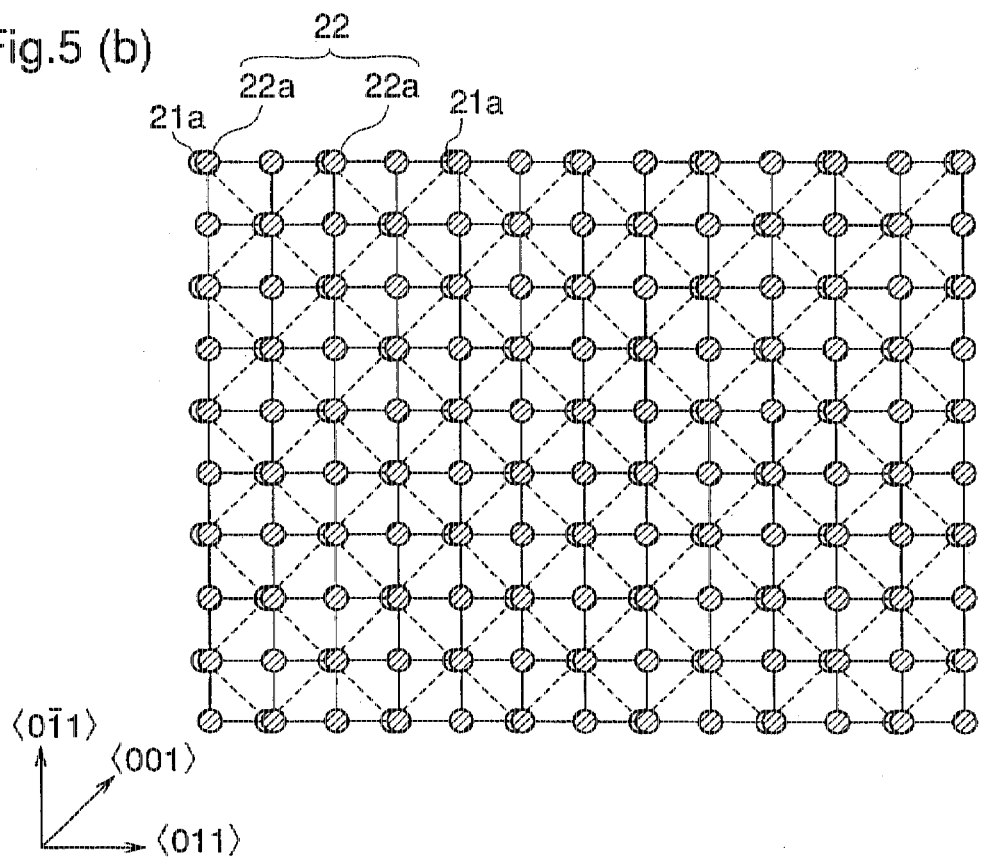

FIGS. 5(a)–5(b) are diagrams for explaining the growing method of a compound semiconductor layer according to the third embodiment of the present invention, in which FIG. 5(a) is a plan view illustrating a crystal lattice structure viewed from the direction perpendicular to the front surface of the semiconductor substrate, and FIG. 5(b) is a plan view illustrating a crystal lattice structure of an epitaxially grown layer the semiconductor substrate, viewed from the direction perpendicular to the front surface of the semiconductor substrate. In the FIGS. 5(a)–5(b), reference numeral 21 designates a semiconductor substrate, numeral 21a designates atoms constituting a semiconductor substrate 21 (hereinafter referred to as substrate atoms), numeral 22 designates an epitaxially grown layer, and numeral 22a designates atoms constituting an epitaxially grown layer 22 (hereinafter, referred to as grown layer atoms). The semiconductor substrate 21 and the epitaxially grown layer 22 comprise a material in which the lattice constant of the semiconductor substrate is about $\sqrt{2}$ times as large as the lattice constant of the epitaxial grown layer 22. The real line connecting the adjacent substrate atoms 21a shows a crystal lattice arrangement of the semiconductor substrate 21 and the dotted line connecting the adjacent grown layer atoms 22a shows a crystal lattice arrangement of the epitaxial grown layer 22. The arrangement direction of the epitaxial grown layer 22 in the surface parallel to the front surface of the semiconductor substrate is a direction inclined by 45° from the arrangement direction of the semiconductor substrate 21. In addition, as shown in FIGS. 5(a)–5(b), in order to fabricate understanding of the positional relation between the substrate atoms 21a and the grown layer atoms 22a, the grown layer atoms 22a in positions overlapping the substrate atoms 21a are shifted a little from their original positions.

A description is given of the principle of this third embodiment. As shown in FIGS. 5(a)–5(b), in a case where the lattice constant of the semiconductor substrate 21 is √2 times as large as the lattice constant of the epitaxially grown layer 22, when the crystal lattice arrangement of the epitaxially grown layer 22 is made in a direction rotated by 45° in the surface parallel to the front surface of the semiconductor substrate 21 with respect to the crystal lattice arrangement of the semiconductor substrate 21, the atoms in the lattices of the epitaxially grown layer 22 are lattice-matched with every other atom in the lattice of the semiconductor substrate 21. Then the non-lattice-matched grown layer atoms 22a have dangling bonds, and the dangling bonds cause point defects in the epitaxial grown layer 22, but no dislocations are produced therein. Therefore, by providing such structure, an epitaxially grown layer with high-quality is fabricated.

In this third embodiment, as shown in FIG. 3, the GaN layer 12 is produced on the CdTe semiconductor substrate 11 having the lattice constant about √2 times as large as the lattice constant of the GaN layer 12 so that the arrangement direction of the lattice in the GaN layer 12 makes an angle of 45° with the arrangement direction of the lattice in the semiconductor substrate 11, whereby a GaN epitaxially grown layer 12 with high-quality is obtained.

A description is given of a method of growing a compound semiconductor layer according to the third embodiment of the present invention. Initially, in the step of FIG. 4(a), the CdTe substrate 11 having a surface which is inclined by several degrees, for example, by 2°, from the {100} plane in the <011> direction is prepared. As shown in FIG. 4(b), enlarging a portion near the surface of the CdTe substrate 11, a plurality of steps each having a height of one atomic layer, i.e., atomic steps 15, are fabricated. The atomic steps 15 are arranged at a constant interval in the inclined direction of the CdTe substrate 11, and extended in the <0$\bar{1}$1> direction so as to make an angle of 45° with the inclined direction of the CdTe substrate 11. The orientation of the plane sandwiched between the atomic steps 15 is {100} plane.

Subsequently, the GaN layer 12 is grown on the surface of the CdTe substrate 11 by so-called step flow growth. The atoms 12a which constitute the GaN layer 12 have the nature of diffusing on the surface and being adsorbed by the atomic step 15 preferentially when the atoms 12 are supplied on a ground crystal. Therefore, the growth on the ground crystal is performed in a transverse direction on the surface with the atomic step 15 as a starting point. The step flow growth means the method of growing the epitaxial growth layer on the ground crystal by using such nature at a unit of one atom. This method is generally performed under an environment of high temperature and high pressure. In the step of FIG. 4(c), using the step flow growth, the GaN layer atoms 12a are diffused on the surface of the CdTe substrate 11 and absorbed by the atomic steps 15, and in the step of FIG. 4(d), the GaN layer 12 is grown so as to be arranged along the atomic steps 15 extending in the <0$\bar{1}$1> direction, thereby producing the GaN layer 12 having lattices arranged in the <0$\bar{1}$1> direction. Therefore, the semiconductor laminated structure 10, in which the GaN layer 12 having the crystal lattices arrangement in the direction producing an angle of 45° with the crystal lattice arrangement of the CdTe substrate 11 is formed on the CdTe substrate 11, is obtained.

In the third embodiment, as shown in FIG. 3, the GaN layer 12 formed on the CdTe substrate 11 is arranged so that the crystal lattices make an angle of 45° with the lattice arrangement direction of the CdTe substrate 11, and the lattice constant of the CdTe substrate 11 is 6.481 Å and the lattice constant of the GaN layer 12 in the cubic system is 4.550 Å, i.e., the lattice constant of the CdTe substrate 11 is about √2 times as large as the lattice constant of the GaN layer 12. Therefore, the GaN layer atoms 12a are lattice-matched with the CdTe substrate atoms 11a for every other atom in the lattice arrangement direction of the GaN layer 12. The distance between two GaN layer atoms 12a which lattice-match with the adjacent two CdTe substrate atoms 11a in the lattice arrangement direction of the CdTe substrate 11 is represented by $$4.550 \times 1.414 = 6.434$$

where the degree of lattice-mismatch between the GaN layer 12 and the CdTe substrate 11 is about 0.7%. Therefore, a semiconductor laminated structure with improved quality and reduced degree of lattice-mismatch is obtained, as compared with the semiconductor laminated structure according to the first embodiment.

According to the third embodiment, since the GaN layer is grown on the CdTe substrate so that the lattice arrangement direction of the GaN layer produces an angle of 45° with the lattice arrangement direction of the CdTe substrate in the plane parallel to the {100} plane of the substrate, it is possible to grow the GaN layer so that the degree of lattice-mismatch is reduced and the crystalline quality is improved, resulting in a compound semiconductor layer with higher quality than that in the first embodiment.

While in the third embodiment the GaN layer 12 is employed as a semiconductor layer which is epitaxially grown on the CdTe substrate 11, in the present invention layers comprising the III-V group compound semiconductor material including nitrogen (N) for V element, such as AlN and InN may be employed with the same effects as in the third embodiment.

While in the third embodiment the CdTe substrate is employed as a substrate and a GaN layer is employed as a layer which is epitaxially grown on the substrate, in the present invention a substrate and a epitaxial grown layer comprising a material, in which a difference between the lattice constant of the substrate and a value of √2 times of the lattice constant of a layer epitaxially grown on the substrate is less than 16% of the lattice constant of the substrate at least, may be employed with the same effects as in the third embodiment.

While in the third embodiment the GaN layer 12 is grown on a surface which is inclined in the <011> direction with respect to the {100} plane of the CdTe substrate 11 by the step flow growth, in the present invention the GaN layer 12 may be grown on a surface which is inclined in the <0$\bar{1}$1>, <01$\bar{1}$>, or <0$\bar{1}\bar{1}$> direction which is equivalent to the <011> direction with respect to the {100} plane of the CdTe substrate, with the same effects as in the third embodiment.

Embodiment 4

Figure 6:
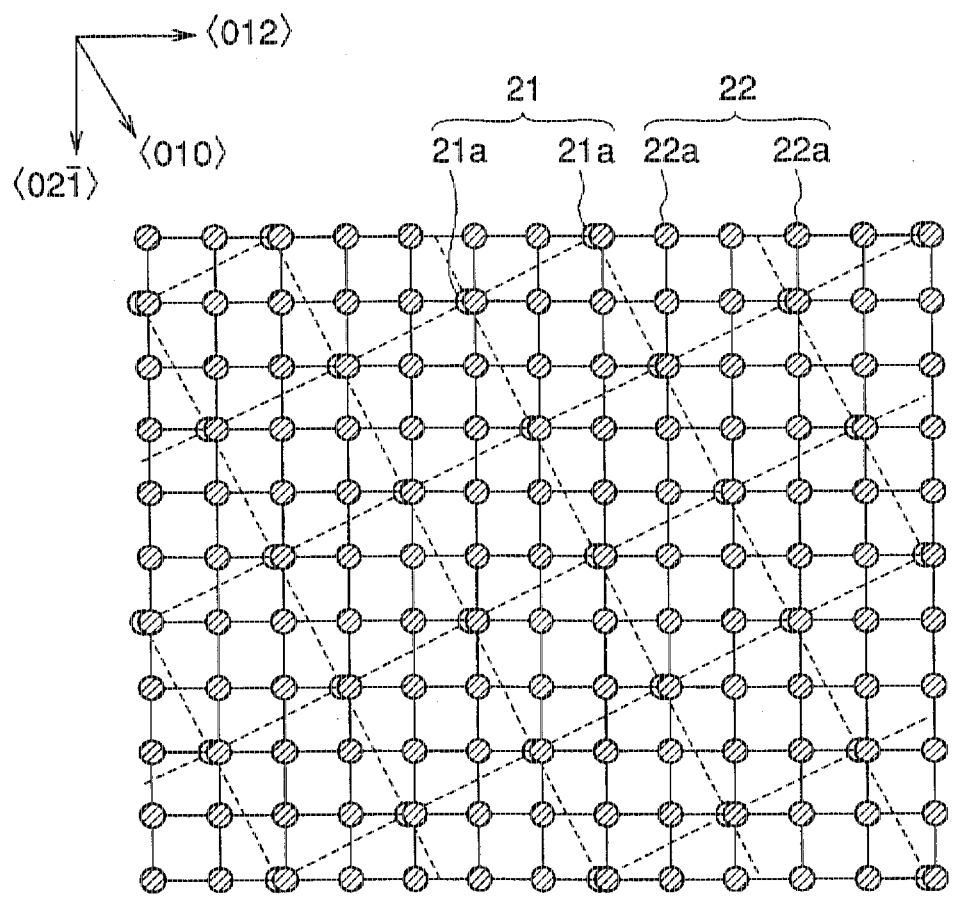
FIG. 6 is a plan view of the crystal lattice structure illustrating a method of growing a compound semiconductor layer according to a fourth embodiment of the present invention.
Figure 7:
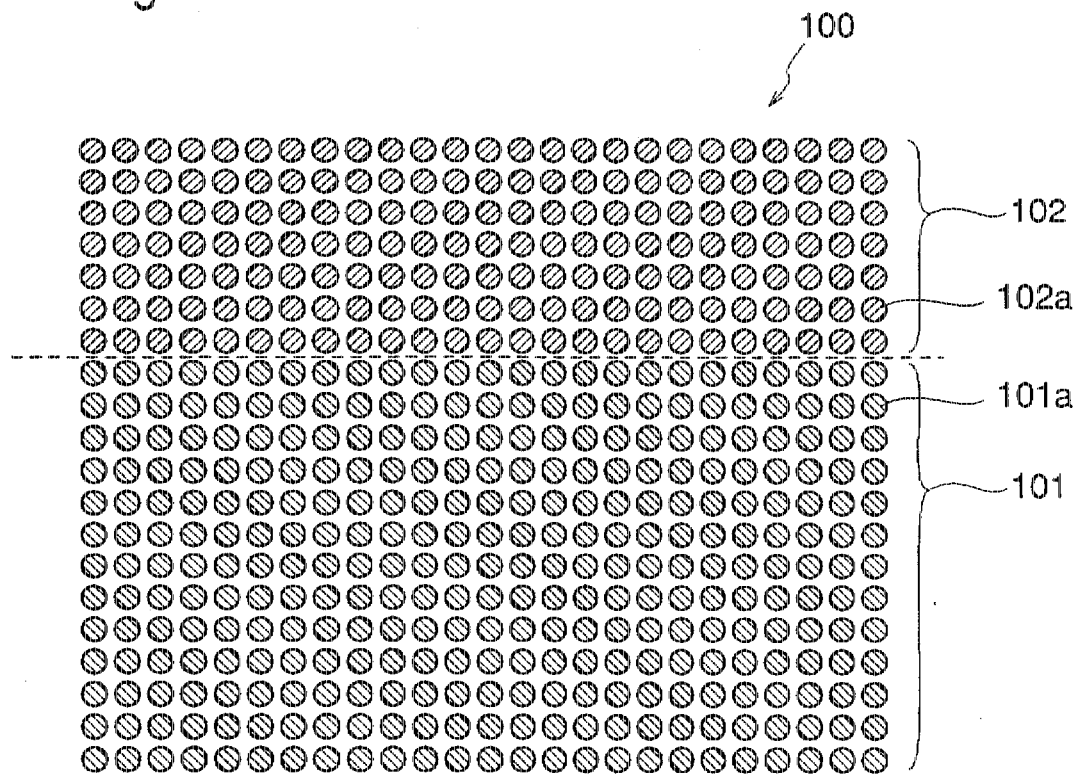
FIG. 7 is a sectional view illustrating a prior art method of growing a prior art compound semiconductor layer.

FIG. 6 is a plan view of a crystal lattice structure illustrating a method of growing a compound semiconductor layer according to a fourth embodiment of the present invention. In FIG. 6, the same reference numerals as in FIG. 5(b) designate the same or corresponding parts.

While in the above-described third embodiment the GaN epitaxial layer 12 is grown on the CdTe substrate 11 having a lattice constant √2 times as large as the lattice constant of the GaN layer 12 so that the lattice arrangement direction of the GaN layer 12 forms an angle of 45° with the lattice arrangement direction of the CdTe substrate 11, in the fourth embodiment an epitaxial layer 22 is grown on the semiconductor substrate 21 having the lattice constant about √5 times as large as the lattice constant of the grown layer 22 so that the lattice arrangement direction of the grown layer 22 forms an angle of 26.62° with the lattice arrangement direction of the semiconductor substrate 21. The substrate having a surface which is inclined by several degrees in any direction of <021>, <02$\bar{1}$>, <0$\bar{2}$1>, <0$\bar{2}\bar{1}$>, <012>, <01$\bar{2}$>, <0$\bar{1}$2>, and <0$\bar{1}\bar{2}$> directions with respect to the {100} plane is prepared, and the epitaxial layer 22 is grown on this substrate by the above-described step flow growth.

In the fourth embodiment, as shown in FIG. 6, the epitaxial layer 22 is grown on the substrate 21 so that the grown layer atom 22a lattice-matches with every fifth atom of the substrate atom 21a in the lattice arrangement direction of the grown layer 22. Since the distance between two GaN layer atoms 22a which lattice-match with adjacent two substrate atoms 21a in the lattice arrangement direction of the substrate 21 is about √5 times as large as the lattice constant of the substrate 21, it makes the degree of lattice-mismatch a low value, with the same effects as in the third embodiment.

While in the third and fourth embodiments the CdTe substrate 11 having a surface which is inclined by about 2° in the prescribed direction with respect to the {100} plane is employed as a CdTe substrate on which the step flow growth is performed, in the present invention an angle of any degree with respect to the {100} plane may be employed as long as the angle enables the step flow growth, with the same effects as in the third and fourth embodiments.

While in the third and fourth embodiments the epitaxial layer comprising such as GaN is grown on the semiconductor substrate by MOCVD, in the present invention any growth method of MBE, GSMBE, CBE, VPE, and ALE may be employed with the same effects as in the third and fourth embodiments.

What is claimed is:

1. A method of growing a compound semiconductor layer including epitaxially growing a layer of a III-V semiconductor layer that includes nitrogen as the Group V element on a front surface of a semiconductor substrate comprising cadmium telluride (CdTe).

2. The method of claim 1 further including, before epitaxially growing the III-V semiconductor layer, forming a thin buffer layer comprising the III-V semiconductor that includes nitrogen on the semiconductor substrate at a low temperature.

3. The method of claim 1 wherein the III-V semiconductor layer including nitrogen is selected from the group consisting of GaN, AlN, InN, and mixtures of at least two of these materials.

4. The method of claim 1 including growing the III-V semiconductor layer by one of metal organic chemical vapor deposition, molecular beam epitaxy, gas source molecular beam epitaxy, chemical beam epitaxy, vapor phase epitaxy, and atomic layer epitaxy.

5. A method of growing a compound semiconductor layer including growing a compound semiconductor layer on a front surface of a semiconductor substrate so that a lattice arrangement direction of the semiconductor layer in a plane parallel to a {100} plane is inclined by an angle with respect to a lattice arrangement direction of the semiconductor substrate in a plane parallel to the {100} plane, thereby making some atoms of the compound semiconductor layer periodically match with some atoms of the semiconductor substrate.

6. The method of claim 5 wherein the front surface of the semiconductor substrate is inclined by an angle that provides an atomic step on the front surface of a substrate, in the direction perpendicular to the lattice arrangement direction of the compound semiconductor layer in the plane parallel to the {100} plane of the compound semiconductor layer, and including growing the compound semiconductor layer by step flow growth.

7. The method of claim 5 wherein:

the semiconductor substrate is CdTe;

the compound semiconductor layer is a III-V compound semiconductor including nitrogen as the Group V element; and the angle of the lattice arrangement direction of the compound semiconductor layer with respect to the lattice arrangement direction of the semiconductor substrate in the plane parallel to the {100} plane is 45°.

8. The method of claim 7 including growing the compound semiconductor layer on the front surface of the semiconductor substrate inclined in the <011> direction with respect to the {100} plane by step flow growth.

9. The method of claim 7 wherein the compound semiconductor layer is selected from the Group consisting of GaN, AlN, InN, and mixtures of at least two of these materials.

10. The method of claim 5 wherein the angle of the lattice arrangement direction of the compound semiconductor layer with respect to the lattice arrangement direction of the semiconductor substrate in the plane parallel to the {100} plane is 26.56°.

11. The method of claim 10 including growing atoms of the compound semiconductor layer on the front surface of the semiconductor substrate which is inclined in the <012> direction with respect to the {100} plane by step flow growth.

12. The method of claim 5 including growing the compound semiconductor layer by one of metal organic chemical vapor deposition, molecular beam epitaxy, gas source molecular beam epitaxy, chemical beam epitaxy, vapor phase epitaxy, and atomic layer epitaxy.

* * * * *